United States Patent [19]

Auray et al.

[11] 3,813,023

[45] May 28, 1974

[54] DESOLDERING DEVICE

[76] Inventors: Didier Henri Clement Auray, 4 Rue Des Tartres, Rueil 92, France; Richard T. Downey, 170 Summer St., Maynard, Mass. 01754; Robert I. Macomber, 46 Matawanaken Trl., Littleton, Mass. 01460

[22] Filed: Dec. 4, 1972

[21] Appl. No.: 311,911

[52] U.S. Cl. ............... 228/19, 29/203 B, 29/203 H, 219/229, 228/54

[51] Int. Cl. ............... B23k 1/00

[58] Field of Search ........ 228/19, 54; 219/229, 230; 118/63; 29/203 B, 203 H

[56] References Cited

UNITED STATES PATENTS

| | | | |
|---|---|---|---|
| 3,084,649 | 4/1963 | Parstorfer | 228/19 X |
| 3,130,286 | 4/1964 | Lenzi | 228/19 UX |
| 3,315,350 | 4/1967 | Kent | 228/54 X |
| 3,529,760 | 9/1970 | Hickman et al. | 228/54 X |
| 3,580,462 | 5/1971 | Vanyi | 228/54 X |
| 3,632,972 | 1/1972 | Halstead | 219/229 |
| 3,649,809 | 3/1972 | Halstead | 219/228 |
| 3,746,239 | 7/1973 | Auray | 228/19 |

*Primary Examiner*—J. Spencer Overholser
*Assistant Examiner*—Robert J. Craig
*Attorney, Agent, or Firm*—Lane, Aitken, Dunner & Ziems

[57] ABSTRACT

A device for desoldering a plurality of soldered connections on a support member including a heat conductive member provided with a contact surface having one or more openings therein for receiving and simultaneously melting the soldered connections. The contact surface is plated with a material that is non-wettable by solder while the walls of the openings are of a material that is wettable by the solder.

10 Claims, 4 Drawing Figures

PATENTED MAY 28 1974 3,813,023

DESOLDERING DEVICE

BACKGROUND OF THE INVENTION

This invention relates to a desoldering device and, more particularly, to a device for desoldering the leads of electronic components from a printed circuit board, or the like.

The use of printed circuit boards of synthetic materials, or the like, which are adapted to receive various electronic components is becoming more and more widespread. In these arrangements the components are placed on one face of the board and the conductive leads of the components are often inserted through holes extending through the board. The leads are then soldered to the opposite face of the board, usually by a conventional wave soldering technique, with the board shielding the components from the heat required to maintain the solder in a liquid state.

After a component has been mounted in the above manner, it is difficult to remove it from the board for replacement, repair, or testing purposes. The difficulties are compounded due to the fact that the component and the printed circuit portion of the board are usually sensitive to heat, and often must be retained in their original state for further use or to determine the cause of any defect. Also, many of the boards are provided with plated-through holes for receiving the leads, in which case a portion of the solder extends within the hole around the lead, which makes it difficult to melt all of the solder.

The most common method of desoldering these components is to use a soldering iron to melt each individual soldered connection. Of course, this is tedious, time consuming and not practical in high-speed production applications. Other techniques employ the use of irons having relatively large tips in order to melt several connections at one time. However, this often results in a flow of the melted liquid solder between the connections causing bridges between the various printed conductors and resulting short-circuits.

In order to attempt to overcome these problems, heat conductive heads of various configurations have been proposed to facilitate the melting of the individual connections. However, when the configurations correspond to the pattern of soldered connections there often is a minimal line, or point, contact between the head and the soldered connections due to microscopic irregularities in their respective surfaces. As a result, the transfer of heat between the head and the soldered connection is very inefficient. Therefore, in order to melt the solder the head must be heated to a relatively high temperature in order to transfer the amount of heat needed to melt the connection. Similarly, if the head is of insufficient mass relative to the mass of the soldered connections, the heat needed to melt the connection must be obtained by heating the head to a relatively high temperature because the heat stored in the head is the product of mass times temperature. This may cause damage to other portions of the board.

Also, in these arrangements, any intimate contact of the face of the head with the printed circuit forces the melted solder to flow laterally which results in frequent bridging between connections. Further, in the type of heads having through holes instead of blind cavities or the like for receiving the soldered connections, the residual flux from the melted solder rises into the holes, partly through capillary action and partly because it is lighter than the solder, and eventually causes the holes to become charred until they are completely plugged up with carbon.

SUMMARY OF THE INVENTION

It is, therefore, an object of the present invention to provide a desoldering device wherein several soldered connections can be simultaneously desoldered without the risk of bridging or short circuiting the various connections.

It is a further object of the present invention to provide a a desoldering device of relatively large mass with respect to the mass of the soldered connections and with a relatively efficient means of heat transfer between the head and the soldered connections in order to reduce the temperature requirements and minimize damage to the printed circuit board.

Toward the fulfillment of these and other objects, the desoldering device of the present invention comprises a heat conductive member defining a contact surface for contacting the soldered connections. The contact surface is of a material that is non-wettable by the solder, and has at least one opening formed therein for receiving the soldered connections. The walls of the opening are of a material that is wettable by the solder and the dimensions of the opening are large enough that it can be filled with solder in a pre-tinning operation without a gas bubble forming in the bottom of the opening, yet small enough that capillary action will retain the solder in the opening.

DESCRIPTION OF THE PREFERRED EMBODIMENTS

Figure 1:
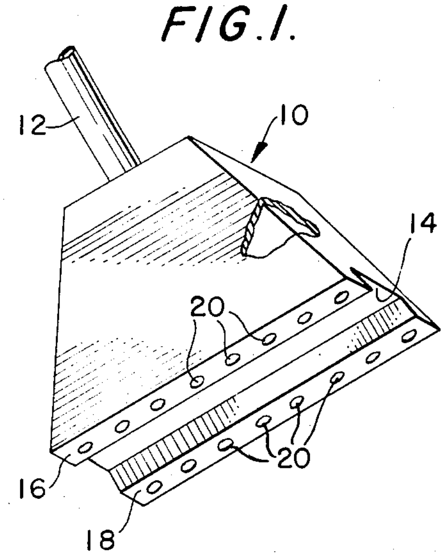
FIG. 1 is a perspective view of one form of the desoldering device of the present invention.

Referring specifically to FIG. 1 of the drawings, the desoldering device of the present invention comprises a heat conductive member 10, shaped in the form of a polyhedron, having a handle 12 attached thereto in any conventional manner. The handle 12 is adapted to conductively heat the member 10 by electric current from appropriate conductors (not shown) connected to the handle, in a conventional manner.

The contact surface of the heat conductive material 10 has an elongated groove 14 therein to focus the heat along two spaced, elongated contact surface portions 16 and 18, each of which has a plurality of spaced cavities 20 provided therein, with the cavities being disposed in a pattern substantially corresponding to the pattern of soldered connections to be desoldered. Each cavity 20 is provided with a bottom portion spaced a predetermined distance from the contact surface for reasons that will be described in detail later.

According to a feature of the present invention the contact surface portions 16 and 18 are formed of a material that is non-wettable by liquid solder while the walls and bottoms of the cavities 20 are of a material that is wettable by the liquid solder. This can be achieved, for example, by manufacturing the heat conductive member 10 of a material which is wettable by the liquid solder, such as copper, and plating the contact surface portions 16 and 18 by a material that is non-wettable by solder, such as chrome. Of course, for aesthetic reasons the entire member 10 can be plated by the non-wettable material, with a cutout portion of the plating being shown in FIG. 1. In any case, the walls and bottoms of the cavities 20 are not plated so that they will retain their wetting characteristics.

Figure 2:
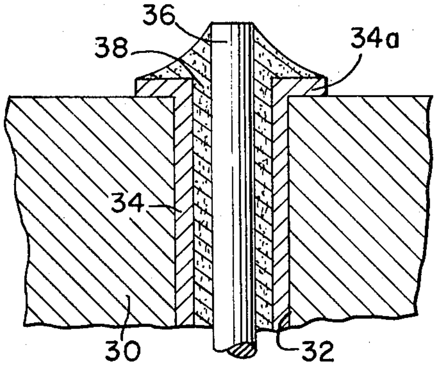
FIG. 2 is an enlarged, partial sectional view of a typical printed circuit board depicting a soldered connection which may be desoldered by the device of the present invention.

FIG. 2 depicts a partial enlarged section of a printed circuit board having a soldered connection which is adapted to be desoldered by the device of the present invention. In particular, the printed circuit board is shown by the reference numeral 30 and has an opening 32 extending therethrough which has a metal wall 34 disposed adjacent the wall of the opening and having a flanged portion 34*a* extending outwardly from the opening and on top of the upper surface of the board 30, as viewed in FIG. 2.

An electrical lead 36 extends from a component (not shown) mounted on the lower surface of the board 32 and through the opening 32. The lead 36 is spaced slightly from the metal wall 34 in the hole 32 and terminates a slight distance from the upper surface of the board 30. The solder is shown in general by the reference numeral 38 and extends between the conductor 36 and the metal wall 34 in the opening with a portion of the solder also being located adjacent the conductor above the flanged portion 34a of the metal wall.

Figure 3:
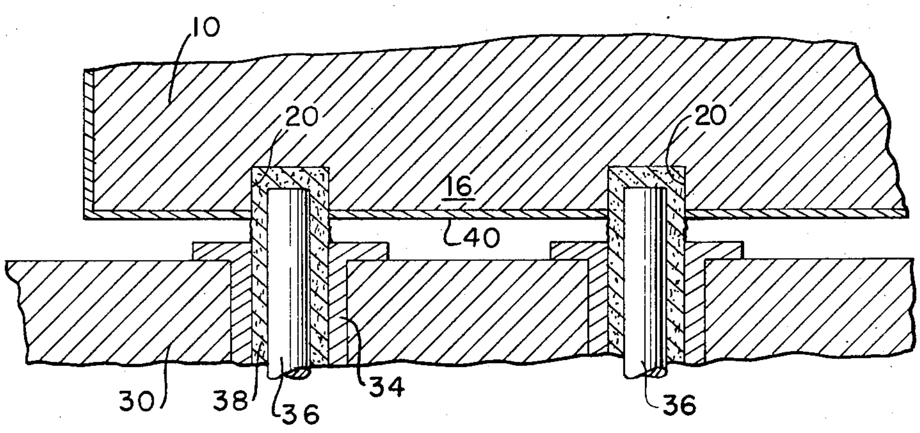
FIG. 3 is a view similar to FIG. 2 but depicting two adjacent soldered connections which are in the process of being desoldered utilizing the device of the present invention.

FIG. 3 depicts the heat conductive member 10 extending over the circuit board 30 after a predetermined time sufficient to melt the solder around the lead 36, but before removal of the latter. In the melting process, the solder already in the cavities 20 as a result of the pre-tinning operation, envelops the upper end portion of the lead 36 and merges with the solder already surrounding this lead. In this manner, the tube of molten solder in the cavities 20 and surrounding lead 36 acts as an efficient heat transfer medium to conduct heat from the entire length of the walls of the cavities 20 to the remaining portion of the solder surrounding the lead 36 in the hole 32. This efficient heat transfer medium, of course, reduces the temperature to which the member 10 must be heated in order to transfer the amount of heat needed for melting the solder, and thus minimizes the possibility of heat damage to the board 30. It is also noted that solder will not tend to be attracted to the remaining portion of the contact surface portion 16 due to the presence of the non-wettable plating, which is shown in general by the reference numeral 40 in FIG. 3. Therefore, bridging, or the flowing of melted solder between the adjacent connections 36, is avoided. As an added advantage, the presence of the wettable bottom in each cavity 20 attracts the solder and, as a result, the flux from the solder that would otherwise accumulate in the cavities, is displaced outwardly.

Of course, when the entire amount of solder 38 is melted, the component and its leads 36 can be simply pulled out away from the circuit board 30 and the heat conductive member 10 can be removed from the vicinity of the board.

Figure 4:
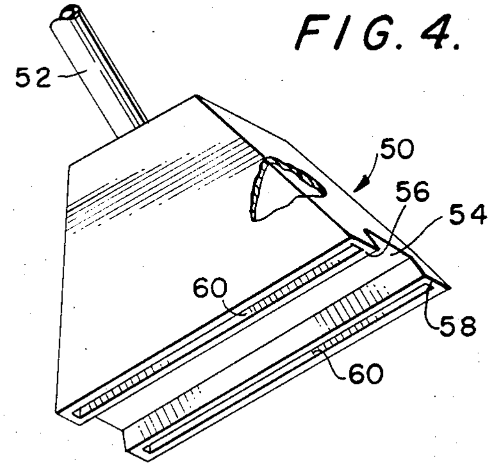
FIG. 4 is a view similar to FIG. 1 but depicting an alternate form of the device of the present invention.

The embodiment of FIG. 4 is similar to that of FIG. 1 and comprises a heat conductive member 50 having an attached handle 52 for transferring heat thereto in a manner identical to that of the previous embodiment. An elongated groove 54 is provided in the contact surface of the member 50 to define two spaced elongated contact surface portions 56 and 58. An elongated slot 60 which is continuous but closed at each end, is provided in each of the contact surface portions 56 and 58 for receiving soldered connections which are disposed in two parallel rows.

As in the previous embodiment, the contact surface portions 56 and 58 are of a material that is non-wettable by solder, such as chrome, while the interior walls and bottoms of the slots 60 are of a material that is wettable by the solder, such as copper, and are pretinned until they are full of solder. This can be achieved in a manner identical to that discussed in connection with the previous embodiment.

The device of FIG. 4 functions similarly to that of FIG. 1 in that the heating of the heat conductive member 50 causes the solder in the slots 60 to melt and to serve as the heat conducting medium by completely enveloping the leads 36 and merging with the solder 38 around such leads. The non-wettability of the material of which the support 30 is made prevents bridging between adjacent connections. Also in this embodiment the melted solder in the slots 60 forms a relatively efficient heat transfer medium between the member 50 and the unmelted portion of the solder in the hole 32 to facilitate the eventual melting of the latter solder without the need for a relatively high temperature.

The heat conductive member 50 of FIG. 4 otherwise functions in an identical manner to the member 10 of the previous embodiment and thus enjoys the same advantages as discussed above.

Of course, other variations of the specific construction and arrangement of the desoldering device disclosed above can be made by those skilled in the art without departing from the invention as defined in the appended claims.

We claim:

1. A device for desoldering a plurality of soldered connections on a support member, said device comprising a heat conductive member defining at least one contact surface of a material that is non-wettable by solder, a plurality of spaced blind cavities formed in said contact surface and extending in a pattern corresponding to the pattern of said soldered connections for receiving said soldered connections, the bottom and the wall of each cavity being of a material that is wettable by the solder and the width and depth of each cavity being sized relative to its corresponding soldered connection so that the melted solder is retained in the cavity by capillary action and so that the melted solder acts as a heat conductive medium between said heat conductive member and unmelted solder, to melt the unmelted solder, and means for applying heat to said heat conductive member.

2. The device of claim 1 wherein a groove is formed in one face of said heat conductive member to define two spaced continuous contact surfaces to focus said heat along said surfaces.

3. The device of claim 2 wherein said contact surfaces extend for the entire length of said face.

4. The device of claim 1 wherein said contact surface is of a chrome material and the bottom and walls of each cavity are of a copper material.

5. A device for desoldering a plurality of soldered connections on a support member, said device comprising a heat conductive member defining at least one contact surface of a material that is non-wettable by solder, a continuous groove extending for the entire length of said contact surface for receiving a row of soldered connections, the bottom and the walls of said groove being of a material that is wettable by the solder, the width and depth of each groove being sized relative to its corresponding soldered connection so that the melted solder is retained in the groove by capillary action and so that the melted solder acts as a heat transfer medium between said heat conductive member and the unmelted solder to melt the unmelted solder, and means for applying heat to said heat conductive member.

6. The device of claim 5 wherein a groove is formed in one face of said heat conductive member to define two spaced continuous contact surfaces to focus said heat along said surfaces.

7. The device of claim 6 wherein said contact surfaces extend for the entire length of said face.

8. The device of claim 5 wherein said contact surface is of a chrome material and the bottom and walls of said groove are of a copper material.

9. The device of claim 5 wherein each of said grooves is closed at both ends.

10. The device of claim 5 wherein said contact surface is flat and has a portion extending to either side of said groove.

* * * * *